United States Patent [19]

Suzuki et al.

[11] Patent Number: 4,977,442
[45] Date of Patent: Dec. 11, 1990

[54] LEAD FRAME AND METHOD OF PRODUCING ELECTRONIC COMPONENTS USING SUCH IMPROVED LEAD FRAME

[75] Inventors: Toshiaki Suzuki; Yoji Murakami; Masao Kobayashi; Osamu Yamauchi, all of Aizuwakamatsu, Japan

[73] Assignee: Fujitsu Limited, Kawasaki, Japan

[21] Appl. No.: 314,793

[22] Filed: Feb. 24, 1989

[30] Foreign Application Priority Data

Feb. 24, 1988 [JP] Japan .................................. 63-042815

[51] Int. Cl.⁵ ...................... H01L 23/48; H01L 23/54
[52] U.S. Cl. .......................................... 357/70; 357/68
[58] Field of Search ...................... 357/70, 68

[56] References Cited

U.S. PATENT DOCUMENTS 4,721,993 1/1988 Walter .................................. 357/70

FOREIGN PATENT DOCUMENTS 0012573 1/1977 Japan ...................................... 357/70
0005557 1/1986 Japan ...................................... 357/70

Primary Examiner—Andrew J. James
Assistant Examiner—S. V. Clark
Attorney, Agent, or Firm—Staas & Halsey

[57] ABSTRACT

A lead frame includes an outside frame portion having an central opening, and a rectangular mount portion supported by the outside frame portion and disposed within the central opening, and on which an electronic element is adapted to be mounted. The lead frame also includes at least one lead element array disposed along a side of the mount portion, respectively, the lead elements included in the array being connected to each other by a common tie bar element, and at least two expandable tie bar elements extending between the outside frame portion and each of the lead element arrays to support each lead element array by the outside frame portion, each of the expandable tie bar elements including a shaped portion which can be expanded by a deformation thereof. In a method of producing an electronic component using the lead frame, a process of bending the lead elements is performed before an electrolytic-plating process thereof.

3 Claims, 5 Drawing Sheets

LEAD FRAME AND METHOD OF PRODUCING ELECTRONIC COMPONENTS USING SUCH IMPROVED LEAD FRAME

BACKGROUND OF THE INVENTION (1) Field of the Invention

The present invention relates to an improvement of a lead frame used in the production of electronic components, and to a method of producing electronic components preferably using such an improved lead frame.

(2) Description of the Related Art

As is well known in this field, a lead frame is used in the production of electronic components, and various different lead frames are configured in accordance with the type of electronic component to be produced.

For example, a lead frame used to produce a quad type electronic component comprises an outside frame portion surrounding a generally rectangular central opening, and a rectangular mount portion disposed within the central opening of the outside frame portion and on which an electronic element, such as an integrated circuit (IC) chip, can be mounted. The rectangular mount portion may be supported by the outside frame portion by a bar element extending therebetween. The lead frame also comprises four lead element arrays disposed along four sides of the rectangular mount portion, respectively, the outer ends of which are integrally connected to the outside frame portion. Namely, the lead elements included in each array extend from an inner side of the outside frame portion toward the corresponding side of the rectangular mount portion. In the quad type electronic component, especially a quad flat package, the IC chip mounted on the rectangular mount portion is sealed with a suitable synthetic resin, such as an epoxy resin, by using a split mold by which the mount portion and the IC chip mounted thereon are enclosed. Accordingly, the lead frame further comprises a rectangular dam-bar element surrounding the rectangular mount portion and integrally formed with the lead elements in such a manner that each of the four sides of the rectangular dam-bar element transversely extends through the lead elements included in the corresponding array. Namely, the lead elements included in each array are connected to each other by one of the four sides of the dam-bar element. When the mounted IC chip is sealed with the resin, the dam-bar element cooperates with the split mold to prevent the resin from leaking out through clearance between the adjacent lead elements. This lead frame arrangement may be formed from a thin Ni-Fe alloy or a Cu alloy plate by a photoetching process or mechanical punching operation.

In the production of the quad type electronic component using the lead frame as mentioned above, the IC chip is mounted on the mount portion of the lead frame by using a silver or gold paste, and then a wire bonding process is performed to establish electrical connections between the IC chip and the lead elements. After the wire bonding step, the mount portion with the IC chip is enclosed by the split mold so that the dam-bar element cooperates with the split mold, the resin is then introduced into the mold, and thus the IC chip, the mount portion thereof, and the inner end portions of the lead elements are sealed in the molded resin. Thereafter, consecutively, the dam-bar element is cut to release the lead elements from the dam-bar connections, and then the lead frame with the sealed IC chip is subjected to an electrolytic-plating process to coat the lead elements with a thin Sn-Pb alloy layer. After the plating process, the lead elements are trimmed and bent by press-cutting in such a manner that the lead elements are detached from the outside frame portion of the lead frame and are bent downwardly with respect to the mount portion thereof, and as a result, the quad type electronic component (QFP) is obtained.

The trimming/bending process is performed in a press-cutting machine comprising a die assembly and a movable assembly associated therewith. In particular, the die assembly includes a bending die having a rectangular recess formed on the top face thereof and four ridge portions formed along the four sides thereof, and a cutting die surrounding the bending die and having four cutting edges disposed in parallel with the four ridge portions. Each of the cutting edges is spaced apart from the corresponding ridge portion and is flush with the top thereof. The movable assembly includes a knockout having a rectangular recess formed on the lower end face thereof and four edge portions formed along the four sides thereof, a stripper surrounding the knockout while maintaining a space therebetween, and the punch disposed in the space between the knockout and the stripper. The knockout and the stripper cooperate with the bending die and the cutting die, respectively, and the punch cooperates with both the bending and cutting dies.

In the trimming/bending process, the lead frame with the sealed IC chip is positioned on the bending die to that the sealed IC chip, i.e., the molded portion, is received by the rectangular recess thereof, the lead elements included in each array extending to bridge the space between the corresponding ridge portion and the corresponding cutting edge. Then, the knockout and the stripper are lowered until engaged with the lead elements and cooperate with the bending die and the cutting die, respectively, so that the lead elements are clamped between the edge portions of the knockout and the ridge portions of the bending die and between the stripper and the cutting die, the molded portion of the lead frame being accommodated within a cavity formed by both the rectangular recesses of the knockout and the bending die. Consecutively, the punch is then lowered until engaged with the lead elements, and cooperates with the bending die and the cutting die, whereby the lead elements are deformed downwardly to conform with an outside profile of the ridge portions of the bending die, while being detached from the outside frame portion of the lead frame.

The prior method of producing electronic components as mentioned above possesses a defect in the trimming/bending process. In particular, during the bending of the lead elements, the plating layers thereof are rubbed against by the punch and thus may be partially scraped from the surface of the lead elements. Also, the scraped fragments of the plating layers may cause a short circuits among the leads of the finished electronic components, which are very close to each other.

To alleviate this defect, i.e., that the plating layers of the lead elements are rubbed by the punch, in another method, the pre-trimmed lead elements are bent by a press machine arranged so that the rubbing action can be eliminated during the bending process. In one type of such a press machine, a cam mechanism is used to impart a cam motion to the punch, to avoid the rubbing action of the punch against the lead elements during the bending process. In another type of press machine, the punch is provided with rollers which impart a bending action to the lead elements, whereby the rubbing action can be eliminated during the bending process. These press machines however are not practical as they are complicated and expensive.

The problem mentioned above can be solved by performing the plating process after the trimming/bending process, but this approach is unadvisable as it is cumbersome and difficult to coat the trimmed and bent leads with a uniform thin Sn-Pb alloy layer by the electrolytic-plating process. Namely, during the electrolytic-plating process, the trimmed and bent leads must be directly connected to terminals connected to an electric source through a lead wire, but the formation of the uniform plating layers on the trimmed and bent leads may be damaged by the direct connections between the trimmed and bent leads and the terminals. However, by using the lead frame according to the present invention, it is possible to perform the plating process after the trimming/bending process without the hindrance as mentioned above.

SUMMARY OF THE INVENTION

An object of the present invention is to provide a lead frame for use in the production of electronic components, and arranged so that the lead elements thereof can be bent without cutting from the outside frame portion of the lead frame.

Another object of the present invention is to provide a method of producing electronic components preferably using such an improved lead frame, wherein a bending process is performed on the lead elements of the lead frame before the plating thereof.

Therefore, in accordance with the present invention, there is provided a lead frame for use in the production of an electronic component, which comprises: an outside frame portion having an central opening formed therein; a mount portion supported by the outside frame portion and disposed within the central opening thereof, and on which an electronic element can be mounted; at least one lead element array disposed along a side of the mount portion, respectively, the lead elements included in the array being connected to each other by a common tie bar element; and at least two expandable tie bar elements extending between the outside frame portion and the lead element array to support the lead element array on the outside frame portion, each of the expandable tie bar elements including a shaped portion which can be expanded by deformation thereof.

In the lead frame according to the present invention, the common tie bar element is preferably integrated with the outer ends of the lead elements included in the lead element array. In this case, each of the expandable tie bar elements is connected to the outside frame portion at one end thereof and to the common tie bar element at the other end thereof. Alternatively, one of the expandable tie bar elements is connected to the outside frame portion at one end thereof and to an outermost one of the lead elements in the array at the other end, and the other expandable tie bar element is connected to the outside frame portion and to the other outermost one of the lead elements in the array at the other end.

Preferably, the expandable tie bar elements for supporting the lead element array on the outside frame portion are symmetrically disposed respectively to the center of the lead element array.

In accordance with the present invention, there is also provided a method of producing an electronic component including an outside frame portion having a central opening formed therein, a mount portion supported by the outside frame portion and disposed within the central opening thereof, and at least one lead element array disposed along a side of the mount portion, respectively, which comprises the steps of: mounting an electronic element on the mount portion of the lead frame; sealing the mount portion of the lead frame, the electronic element mounted thereon, and the inner end portions of the lead elements included in the lead element array with a suitable material; bending outer portions of the lead elements extending from the sealed portion by a press; performing an electrolytic-plating process to coat the bent lead elements of the lead frame with a suitable alloy layer; and trimming the bent and plated lead elements of the lead frame. In this production method, the bending step may be performed before the mounting step.

In accordance with the present invention, there is further provided a method of producing an electronic component using the improved lead frame as mentioned above, comprising the steps of: mounting an electronic element on the mount portion of the lead frame; sealing the mount portion of the lead frame, the electronic element mounted thereon, and the inner end portions of the lead elements of said lead frame with a suitable material; bending outer portions of the lead elements extending from the sealed portion by a press, the shaped portions of the expandable tie bar elements for supporting the lead element array from the outside frame portion being expanded to maintain the connection between the lead element array and the outside frame portion; performing an electrolytic-plating process to coat the bent lead elements of the lead frame with a suitable alloy layer; and trimming the bent and plated lead elements of the lead frame. In this production method, the bending step may be also performed before the mounting step.

BRIEF DESCRIPTION OF THE DRAWINGS

The present invention will become more apparent from the following detailed description given in accordance with the accompanying drawings, in which.

DESCRIPTION OF THE PREFERRED EMBODIMENTS

Figure 1:
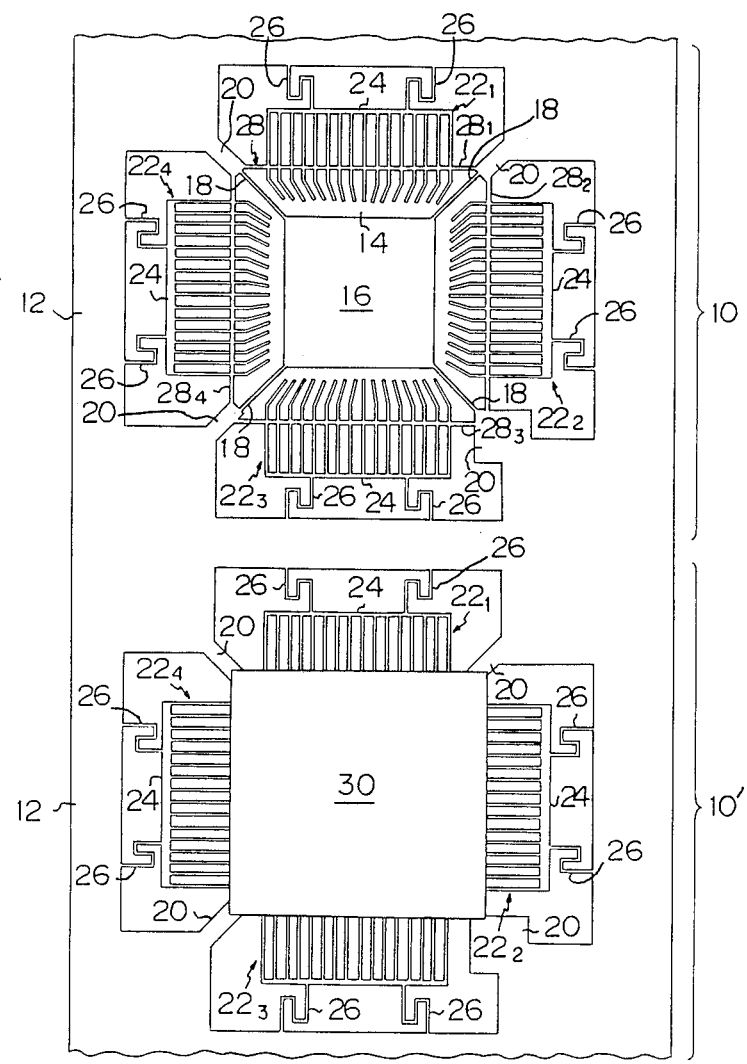
FIG. 1 is a detailed plan view of a part of a lead frame strip including lead frames configured according to the present invention.

FIG. 1 shows a part of a lead frame strip in which lead frames according to the present invention are continuously formed, and which may be obtained from a thin Ni-Fe alloy or Cu alloy blank by a photoetching process or mechanical punching. The lead frame, per se, generally designated by a reference numeral 10, comprises an outside frame portion or cradle portion 12 having a central opening 14 formed therein, and a rectangular mount portion 16 disposed within the central opening 14 for mounting an electronic element such as an integrated circuit (IC) chip thereon. The mount portion 16 is supported by the cradle portion 12 through the intermediary of four tie bar elements 18. That is, each of the tie bar elements 18 is connected at one end thereof to a corresponding one of plural tongue elements 20 which extend from inner corners of the cradle portion 12, and at the other end thereof to the corresponding one of the corners of the mount portion 16.

The lead frame 10 also comprises four lead element arrays $22_1$, $22_2$, $22_3$ and $22_4$ disposed in the opening 14 along the respective four sides of the mount portion 16, respectively, as shown in FIG. 1. The lead elements included in each array $22_1$, $22_2$, $22_3$, $22_4$ are disposed substantially in parallel with each other and extend perpendicularly with respect to the corresponding side of the mount portion 16, and are connected to each other by a common tie bar element 24 integrated with the outer ends thereof. Alternatively, the common tie bar element may transversely extend through the lead elements in each array at the inside of the outer ends thereof.

According to the present invention, the lead frame 10 is characterized in that the lead elements included in each array are supported by the cradle portion 12 through the intermediary of at least two expandable tie bar elements 26, each of which is connected to the cradle portion 12 at one end thereof and to the corresponding common tie bar element 24 at the other end thereof. As shown in FIG. 1, each of the tie bar elements 26 has a double U-turn shape and thus can be expanded by deformation of the shaped portion thereof. The expandable tie bar elements may have another shape, such as a zigzag form. Preferably, as shown in FIG. 1, the two expandable tie bar elements 26 are symmetrically disposed with respect to the center of the respective lead element array $22_1$, $22_2$, $22_3$, $24_4$, for the reasons mentioned hereinafter.

The lead frame 10 further comprises a rectangular dam-bar element 28 surrounding the mount portion 16, and integrally formed with the lead elements 22 in such a manner that each of the four sides $28_1$, $28_2$, $28_3$ and $28_4$ of the rectangular dam-bar element 28 transversely extends through the lead elements included in the corresponding array $22_1$, $22_2$, $22_3$, $22_4$. In particular, the lead elements included in each array are connected to each other by the corresponding one of the four sides $28_1$, $28_2$, $28_3$ and $28_4$ of the dam-bar element 28, each side being connected to the corresponding two tongue elements 20 at the ends thereof. The rectangular dam-bar element 28 cooperates with a split mold (not shown) by which the mount portion 16 and an electronic element (i.e. IC chip) mounted thereon, and the inner end portions of the lead elements are enclosed when to be sealed with a suitable synthetic resin such as epoxy resin, whereby the resin introduced into the split mold is prevented from leaking out through clearances between the lead elements. In FIG. 1, a lead frame, generally designated by a reference numeral 10', has a sealed or molded portion 30 in which the mount portion 16 and the electronic element mounted thereon, and the inner end portions of the lead elements are embedded. When comparing the lead frame 10 with the lead frame 10', it can be easily be understood that the profile of the molded portion 30 is defined by the rectangular dam-bar element 28. Note, in the lead frame 10', the dam-bar element 28 is cut so that the lead elements are released from the dam-bar connections.

In the lead frame arrangement, although the rectangular mount portion 16 is supported by the cradle portion 12 through the intermediary of the tie bar elements 18, this support may be made by connecting the mount portion to a part of the lead elements.

Figure 2:
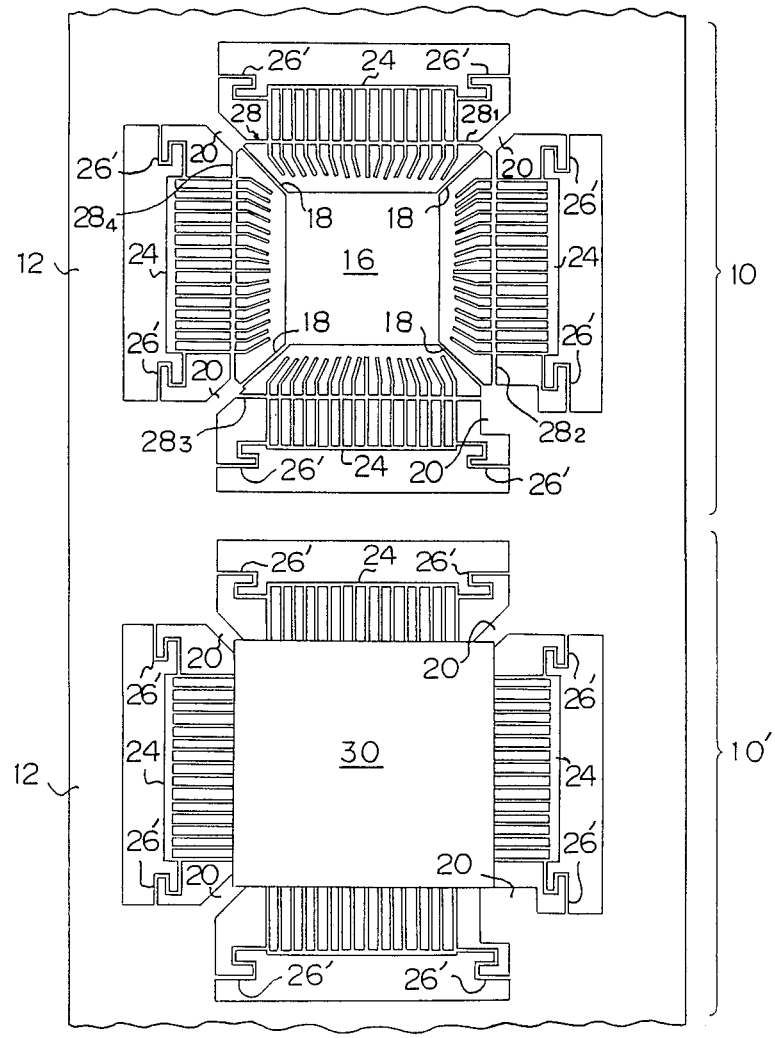
FIG. 2 is a plan view showing a modified embodiment of FIG. 1.

FIG. 2 shows a modificated embodiment which is identical to that of FIG. 1 except that the expandable tie bar elements 26' for supporting the lead elements in each array from the cradle portion 12 are not connected to the common tie bar element 24 but are connected to the outermost lead elements in each array.

Figure 3:
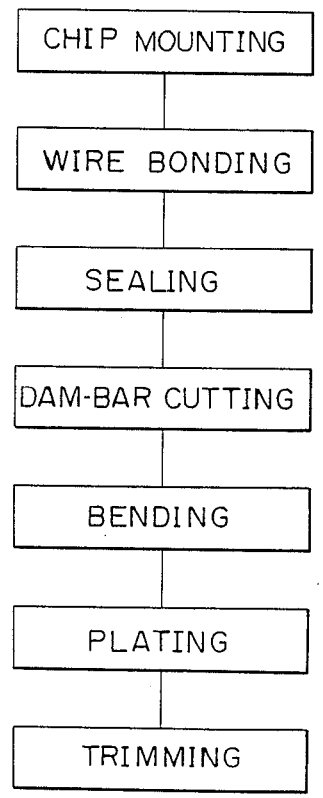
FIG. 3 is a flow chart for explaining a method of producing an electronic component using the lead frame strip of FIG. 1.

A method of producing a quad type electronic component using the lead frame strip of FIG. 1 will be now explained by way of example:

The production method may be executed in accordance with the flow chart of FIG. 3, which basically includes the chip bonding, wire bonding, sealing, dam-bar cutting, bending, electrolytic-plating, and trimming steps.

In the chip mounting step, an IC chip is mounted on the mount portion 16 of the lead frame 10 by a suitable adhesive paste such as a silver or gold paste. This bonding process is performed in a well-known chip mounting machine, i.e., a so-called die bonder.

In the wire-bonding step, electrical connections between the mounted IC chip and the lead elements of the lead frame 10 are established by using a gold wire. This wire bonding process may be performed in a well-known wire bonding machine.

In the sealing step, the mount portion 16 and the IC chip mounted thereon, and the inner end portions of the lead elements are enclosed by a split mold, and then a suitable synthetic resin, such as an epoxy resin, is introduced into the split mold, wherein the IC chip and the mount portion 16 thereof, and the inner end portions of the lead elements are sealed in the molded resin. As mentioned above, the split mold cooperates with the dam-bar element 26 of the lead frame 10 to prevent the resin from leaking out through the clearance between the lead elements. This sealing or molding process may be performed in a well-known molding machine having a part formed by a split mold.

In the dam-bar cutting step, the dam-bar element is cut by a comb-like cutter having cutting edges arrayed at the same pitch as the lead elements, whereby the lead elements are released from the dam-bar connections. This dam-bar cutting process may be performed with a well-known dam-bar cutting machine including the comb-like cutter as a part thereof.

In the bending step, the lead elements which extend from the four sides of the molded portion 30 are bent until they extend downwardly extended with respect to the molded portion 30 of the lead frame. Note, the bending of the lead elements can be carried out without detaching them from the cradle portion 12 of the lead frame.

Figure 4A:
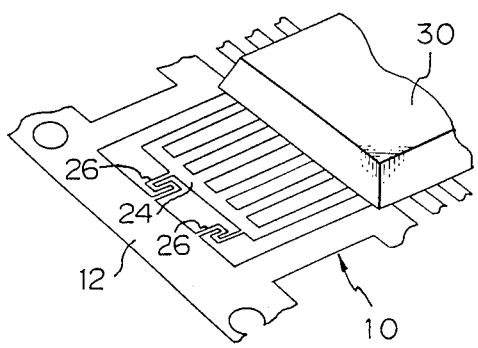
FIGS. 4a and 4B are schematic perspective views showing a part of the lead frame for explaining a bending process which forms a step of the production method according to the present invention.
Figure 4B:
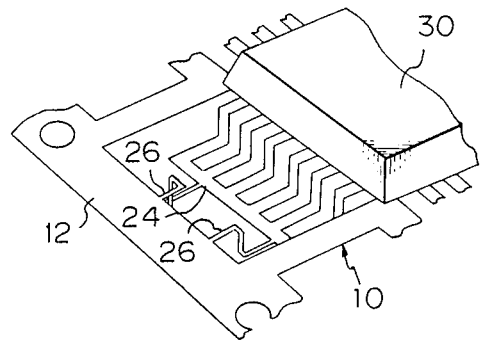

In other words, although the lead elements of the lead frame are bent as mentioned above, the connection between the lead elements and the cradle portion 12 can be maintained by expanding the expandable tie bar elements 26. This can be easily understood by reference to FIGS. 4A and 4B; FIG. 4A shows a part of the lead frame with the sealed or molded portion 30, in which the lead elements are shown before the bending process, and FIG. 4B shows the same part as in FIG. 4A, but after the bending process. As apparent from FIGS. 4A and 4B, while the lead elements are bent, the expandable tie bar elements 26 are expanded due to the double U-turn portion thereof, whereby the lead elements can be bent without detaching them from the cradle portion 12 of the lead frame.

Figure 5A:
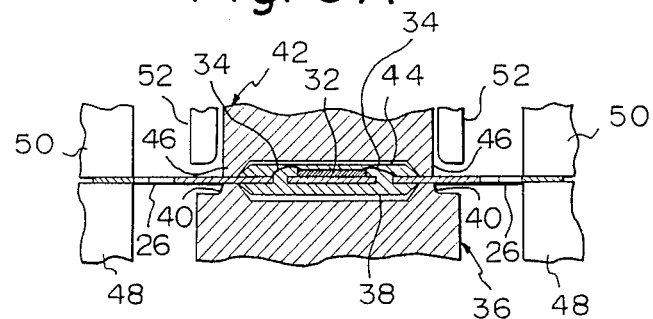
FIGS. 5A and 5B are schematic sectional views partially showing a bending machine in which the bending process is performed.
Figure 5B:
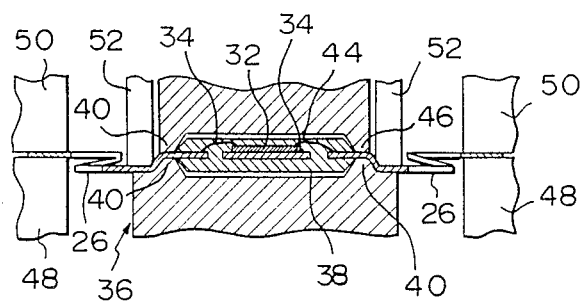

The bending process may be performed in a bending machine as partially and schematically shown in FIGS. 5A and 5B. In FIGS. 5A and 5B, the lead frame with the molded portion, which is set in the bending machine, is also illustrated, and reference numerals 32 and 34 designate the IC chip and the bonded wire, respectively, which are embedded in the molded portion. The bending machine comprises a bending die 36 having a rectangular recess 38 formed on the top face thereof and four ridge portions 40 (only two of which are shown in FIGS. 5A and 5B) formed along the four sides of the rectangular recess 38, and a knockout 42 having a rectangular recess 44 formed on the lower end face thereof and four edge portions 46 (only two of which are shown in FIGS. 5A and 5B) formed along the four sides of the rectangular recess 44. The bending die 36 and the knockout 42 cooperate during the bending process, as mentioned hereinafter. The bending machine also comprises a lower clamp member 48, which surrounds the bending die 36 while maintaining a space therebetween, and an upper clamp member 50, which cooperates with the lower clamp member 48 and surrounds the knockout 42 while maintaining a space therebetween. As apparent from FIGS. 5A and 5B, the clamping face, or top face, of the lower clamp member 48 is flush with the tops of the ridge portions 40. The bending machine further comprises a punch 50 disposed in the space between the knockout 42 and the upper clamp member 50, and cooperating with the outside profiles of the ridge portions 40 of the bending die 38 during the bending process, as mentioned hereinafter.

In the bending process, the lead frame with the sealed IC chip is positioned on the bending die 36 so that the sealed IC chip, i.e., the molded portion 30, is received in the rectangular recess 38 of the bending die 36; the lead elements and the cradle portion 12 of the lead frame resting on the ridge portions 40 of the bending die 36 and on the clamp face of the lower clamp member 48, respectively. Then the knockout 42 and the upper clamp member 50 are lowered until engaged with the lead elements and the cradle portion 12 of the lead frame, and cooperate with the bending die 36 and the lower clamp member 48, respectively, so that the lead elements and cradle portion 12 are clamped between the edge portions 46 of the knockout 42 and the ridge portions 40 of the bending die 36 and between the upper and lower clamp members 50 and 48, respectively (FIG. 5A), the molded portion 30 of the lead frame being accommodated within a cavity formed by the rectangular recesses 44 and 38 of the knockout 42 and the bending die 36. Consecutively, the punch 52 is then lowered until engaged with the lead elements, and cooperates with the outside profile of the ridge portions 40 of the bending die 36, whereby the lead elements are deformed downward to conform with the outside profile of the ridge portions 40, but the connection between the lead elements and the cradle portion 12 is maintained due to the expansion of the expandable tie bar elements 26, as shown in FIG. 5B. Note, since the two expandable tie bar elements 26 are symmetrically disposed with respect to the center of each lead element array $22_1$, $22_2$, $22_3$, $22_4$, it is possible to avoid warping of the bent lead elements in each array, which may be caused by a resilient restoration force of the expanded tie bar elements 26.

Preferably, the chip mounting, wire bonding, sealing, dam-bar cutting, and bending processes as mentioned above are performed in a working line along which the working stages, namely, the chip mounting, wire bonding, sealing, dam-bar cutting, and bending machines are positioned. With this arrangement, it is possible to efficiently perform the processes by passing the lead frame strip of FIG. 1 through the working line.

In the plating step, the lead frames included in the lead frame strip and subjected to the above-mentioned processes, are electrolytically plated so that the bent lead elements in each lead frame are coated with a thin Sn-Pb alloy layer. This electrolytic-plating process may be performed with a well-known electrolytic-plating equipment which includes an electrolytic cell holding an electrolyte. During the electrolytic-plating process, the lead frame strip is partially immersed in the electrolyte so that the bent lead elements included therein are completely submerged in the electrolyte, and a portion of the lead frame strip protruded from the electrolyte is connected to a terminal which is connected to an electric source, whereby an electric current is applied to the bent lead elements in each array through the intermediary of the two expanded tie bar elements 26. Note, the symmetrical arrangement of the tie bar elements 26 contributes to a uniform application of the electric current to the bent lead elements in each array $22_1$, $22_2$, $22_3$, $22_4$, whereby the plating layer can be uniformly formed thereon. In this sense, the embodiment of FIG. 1 is preferred to that of FIG. 2 in that the electric current can be more uniformly applied to the bent lead elements in each array.

Figure 6:
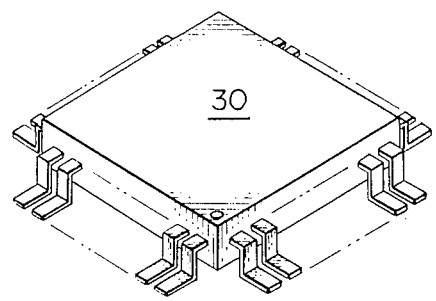
FIG. 6 is a perspective view showing a finished quad type electronic component produced by the production method according to the present invention.

In the trimming step, the lead elements in the four arrays $22_1$, $22_2$, $22_3$ and $22_4$ are cut from the common tie bar elements 24, and thus a quad flat package as an electronic component is obtained, as shown in FIG. 6. This trimming process may be performed in a well-known trimming machine.

Figure 7:
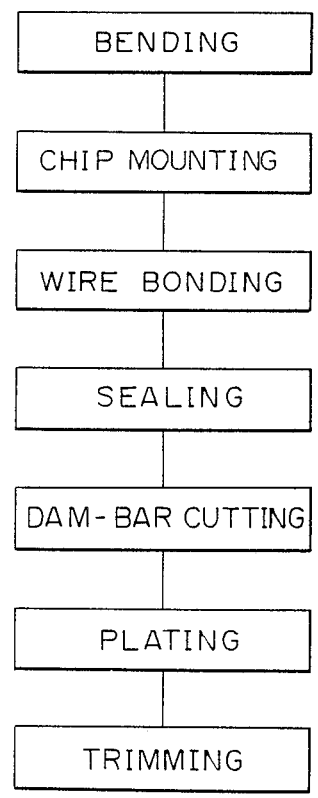
FIG. 7 is a modified flow chart of FIG. 3.

FIG. 7 shows a modified flow chart of FIG. 3, in which the bending process is first performed. Note, as long as the bending process is performed before the plating process, the bending step may be incorporated anywhere in the flow chart of FIG. 3.

In the production method as mentioned above, the mounted IC chip may be sealed by using two ceramic plate elements and a glass material having a low melting point. Namely, the mounted IC chip is sandwiched between the two ceramic plate elements which are adhered to each other by the glass material. In this case, of course, the dam-bar element is omitted from the lead frame.

A lead frame used to produce a dual in-line type electronic component (DIP) can be also arranged in accordance with the present invention, but in this lead frame arrangement, only two lead element arrays are disposed along a pair of opposed sides of the rectangular mount portion.

Furthermore, a lead frame used to produce an electronic component having a single bent lead array can be also arranged in accordance with the present invention. Of course, in this case, only one lead element array is disposed along a side of the mount portion.

It should be understood by those skilled in the art that the foregoing description is a preferred embodiment of the invention and that various changes and modifications may be made thereto without departing from the spirit and scope thereof.

We claim:

1. A lead frame for use in the production of an electric component, comprising:
   an outside frame portion having a central opening formed therein and defining interior sides of the outside frame portion;
   a mount portion for mounting an electronic component thereon, supported by said outside frame portion and disposed within said central opening thereof with the exterior sides of the mount portion in spaced relationship from the corresponding interior sides of the outside frame portion;
   at least one lead element array, comprising plural lead elements, disposed along an associated one of said exterior sides of said mount portion and a common tie bar element associated with each said lead element array, said common tie bar element being integrated with the outer ends of said plural lead elements of said array and thereby connecting together all of said plural lead elements thereof; and
   at least two expandable tie bar elements associated with each said lead element array, extending between and interconnecting said outside frame portion and said associated lead element array thereby to support said lead element array on said outside frame portion, each of said expandable tie bar elements being connected at one end thereof to said outside frame portion and at the other end thereof to said common tie bar element and including a shaped portion which can be expanded by deformation thereof.

2. A lead frame for use in the production of an electric component, comprising:
   an outside frame portion having a central opening formed therein and defining interior sides of the outside frame portion;
   a mount portion for mounting an electronic component thereon, supported by said outside frame portion and disposed within said central opening thereof with the exterior sides of the mount portion in spaced relationship from the corresponding interior sides of the outside frame portion;
   at least one lead element array, comprising plural lead elements, disposed along an associated one of said exterior sides of said mount portion and a common tie bar element associated with each said lead element array and connecting together all of said plural lead elements of said associated lead element array; and
   at least two expandable tie bar elements associated with each said lead element array, expanding between and interconnecting said outside frame portion and said associated lead element array thereby to support said lead element array on said outside frame portion, one of said expandable tie bar elements being connected at one end thereof to said outside frame portion and at the other end thereof to an outermost one of the lead elements of said array and another of said expandable tie bar elements being connected at one end thereof to said outside frame portion and at the other end thereof to the other outermost one of the lead elements of said array, and each of said expandable tie ar elements including a shaped portion which can be expanded by deformation thereof.

3. A lead frame for use in the production of an electric component, comprising:
   an outside frame portion having a central opening formed therein and defining interior sides of the outside frame portion;
   a mount portion for mounting an electronic component thereon, supported by said outside frame portion and disposed within said central opening thereof with the exterior sides of the mount portion in spaced relationship from the corresponding interior sides of the outside frame portion;
   at least one lead element array, comprising plural lead elements, disposed along an associated one of said exterior sides of said mount portion and a common tie bar element associated with each said lead element array, said common tie bar element connecting together all of said plural lead elements of said associated lead element array; and
   at least two expandable tie bar elements associated with each said lead element array, extending between and interconnecting said outside frame portion and said lead element array thereby to support said lead element array on said outside frame portion, each of said expandable tie bar elements being disposed symmetrically relatively to the center of said associated lead element array and each including a shaped portion which can be expanded by deformation thereof.

* * * * *

UNITED STATES PATENT AND TRADEMARK OFFICE
CERTIFICATE OF CORRECTION

PATENT NO. : 4,977,442

DATED : Dec. 11, 1990

INVENTOR(S) : SUZUKI et al.

It is certified that error appears in the above-identified patent and that said Letters Patent is hereby corrected as shown below:

```
Title page, [57] ABSTRACT, line 2, change "an" to --a--.

Col. 2,  line 30, change "to" to --so--.

Col. 6,  line 64, delete "extended".

Col. 10, line 11, change "expanding" to --extending--;
         line 23, change "ar" to --are--.
```

Signed and Sealed this

Eighth Day of September, 1992

Attest:

DOUGLAS B. COMER

*Attesting Officer*     *Acting Commissioner of Patents and Trademarks*